United States Patent [19]
Ronsheim

[11] Patent Number: 6,114,257
[45] Date of Patent: Sep. 5, 2000

[54] PROCESS FOR MODIFIED OXIDATION OF A SEMICONDUCTOR SUBSTRATE USING CHLORINE PLASMA

[75] Inventor: Paul A. Ronsheim, Hopewell Junction, N.Y.

[73] Assignee: International Business Machines Corporation, Armonk, N.Y.

[21] Appl. No.: 09/153,986

[22] Filed: Sep. 16, 1998

[51] Int. Cl.[7] .......................... H01L 21/31; H01L 21/469
[52] U.S. Cl. .......................... 438/779; 438/765; 438/766; 438/767; 438/769; 438/770; 438/774
[58] Field of Search .................................. 438/779, 595, 438/966, 766, 769, 770, 765, 774

[56] References Cited

U.S. PATENT DOCUMENTS

| | | | |
|---|---|---|---|
| 4,743,563 | 5/1988 | Pfiester et al. | 437/24 |
| 5,108,939 | 4/1992 | Manley et al. | 437/43 |
| 5,330,928 | 7/1994 | Tseng | 437/52 |
| 5,523,247 | 6/1996 | Wright | 437/34 |
| 5,798,042 | 8/1998 | Chu et al. | 210/490 |
| 5,989,956 | 11/1999 | Huang | 438/254 |

OTHER PUBLICATIONS

"Kinetics of the Thermal Oxidation of Silicon in O2/HCl Mixtures" by D.W. Hess & B.E. Deal. J. Electrochem. Soc.: Solid State Science & Technology, May, 1977. pp. 735–739.

"Silicon Processing for the VLSI Era, Volume 1: Process Technology" by Stanley Wolf & Richard N. Tauber. Published by Lattice Press, 1986. pp. 211–219.

"Analysis of the Etching of Silicon in an Inductively Coupled Chlorine Plasma Using Laser Thermal Desorption" by J. Y. Choe, I. P. Herman, and V. M. Donnelly. J. Vac. Sci. Technol. A 15(6) Nov./Dec. 1997. pp 3024–3026.

John L. Vossen and Werner Kern, eds., Thin Film Processes, Academic Press: New York, p. 544, 1978.

*Primary Examiner*—Charles Bowers
*Assistant Examiner*—Erik Kielin
*Attorney, Agent, or Firm*—Ratner & Prestia; H. Daniel Schnurmann

[57] ABSTRACT

A process for thermal oxidation of a semiconductor substrate comprising exposing the substrate to a chlorine plasma, and then heating the substrate in an oxidizing ambient. The substrate may comprise silicon, germanium, or a combination thereof. The heating step may further comprise heating at a temperature of between about 750° C. and about 850° C.

15 Claims, 4 Drawing Sheets

PROCESS FOR MODIFIED OXIDATION OF A SEMICONDUCTOR SUBSTRATE USING CHLORINE PLASMA

TECHNICAL FIELD

The present invention relates generally to oxidation of semiconductor substrates and, more specifically, to oxidation of silicon, germanium, or a combination thereof during fabrication of semiconductors.

BACKGROUND OF THE INVENTION

At various stages during the manufacture of an integrated circuit on a semiconductor substrate it may be necessary to create an area of oxide coating. Traditionally, semiconductor substrates are silicon and the desired oxide coating is silicon dioxide. Oxidation of silicon is a thermally dependant process, generally performed at temperatures of between 900–1050° C. It is known that the thermal oxidation rate of silicon at those temperatures is further dependent on many parameters, including, but not limited to: the crystallographic orientation of the Si; the Si doping level; the presence of halogen impurities (Cl, HCl, TCA, TCE) in the gas phase; the pressure during growth; the presence of a plasma during growth; and the presence of a photon flux during growth. In addition to the use of halogens in the gas phase during an oxidation step, it is also known to use ion implantation to selectively implant halogen ions in silicon to provide simultaneous differential (greater) oxidation of the implanted regions vs. non-implanted regions during an oxidation step.

The high temperatures traditionally used for silicon oxidation have drawbacks, however, at certain stages of semiconductor manufacture. For instance, high temperatures may cause undesired diffusion of dopants, which in turn may degrade performance of the semiconductor device. Thus, for any oxidation step performed after well dopants are in place, or after source and drain diffusion regions have been created, the oxidation step creates the undesired effect of redistributing dopants by diffusion.

For example, after pattern etching, such as reactive ion etching (RIE) of a polygate, certain features in the device structure require an oxidation step to repair undesired etch features or defects. These defects often occur on sidewalls or non-planar structures of the device.

Referring now to FIGS. 1–4, there is illustrated a process for etching a gate structure 20. As shown in FIG. 1, a typical semiconductor wafer 9 may comprise a doped well 10 in substrate 11, a gate dielectric or oxide layer 12 above the well, and a polysilicon layer 14 disposed on top of the gate oxide layer. The typical process for making a patterned gate structure 20 (shown in FIG. 4) comprises applying a photoresist 18 over the polysilicon layer 14 as shown in FIG. 1. The photoresist 18 is then exposed and developed in a pattern that exposes regions 22, as shown in FIG. 2. The layers under the exposed regions 22 will be removed in an etching process such as RIE, while the layers under protective photoresist 18' will not be removed.

RIE removes the exposed regions 22 in an essentially anisotropic, or vertical, manner to create isolated gate structure 20 under protective photoresist 18', as shown in FIG. 3. Often, to fully remove all the unwanted polysilicon gate material from topographic features in the device structures, a timed or end-pointed "over-etch" is used. During this over-etch, the thin gate oxide layer 12 under the gate polysilicon layer 14 may be etched out from under the edge 15 of the gate polysilicon layer, causing undercut 24 in sidewall 26. The sidewall 26 is critical for device reliability (electric fields, and therefore oxide damage, are most severe here), so the gate oxide 12 must be re-grown on sidewall 26 before any further processing is done. Typically, the photoresist 18 is removed, and a sidewall oxidation process oxidizes the polysilicon gate edge 15 and the adjacent area. The sidewall oxidation fills in undercut 24 in gate oxide 12 of FIG. 3, generally resulting in a repaired gate oxide 112, as shown in FIG. 4. Gate oxide 112 as shown in FIG. 4 after sidewall oxidation, is generally thicker than the original gate oxide 12 of FIG. 3. Excess portions of the repaired gate oxide 12 beyond the portion directly under gate polysilicon layer 14, may later be removed.

A high-temperature oxidation (900–1050° C.) is conventionally used for this sidewall oxidation. Because the high-temperature oxidation is done after all the doping is completed in well 10, the high-temperatures may diffuse the dopants, potentially resulting in degraded device performance.

In view of the shortcomings of the prior art, there is a need for a silicon oxidation process that minimizes dopant diffusion.

SUMMARY OF THE INVENTION

The present invention relates to a process for thermal oxidation of a semiconductor substrate, the process comprising exposing the substrate to a chlorine plasma, and then heating the substrate in an oxidizing ambient. The heating step may further comprise heating at a temperature of between 750° C. and 850° C.

The present invention further relates to simultaneous thermal oxidation of a plurality of crystallographic orientations, the process comprising the steps of exposing the plurality of crystallographic orientations simultaneously to a chlorine plasma, and then heating the plurality of crystallographic orientations simultaneously in an oxidizing ambient.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 5:
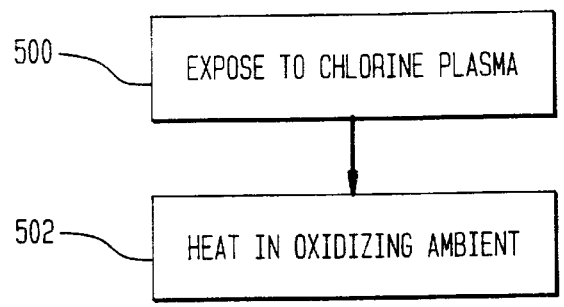
FIG. 5 is a flowchart depicting an exemplary process of the present invention.

Referring now to the drawing, wherein like reference numerals refer to like elements throughout, FIG. 5 depicts a flowchart of a thermal oxidation process according an exemplary embodiment of the present invention. Essentially, the invention comprises exposing a substrate, or a portion of a substrate, to a chlorine plasma in step 500, and then heating the substrate in an oxidizing ambient in step 502. The invention may be further understood with respect to specific examples.

Figure 1:
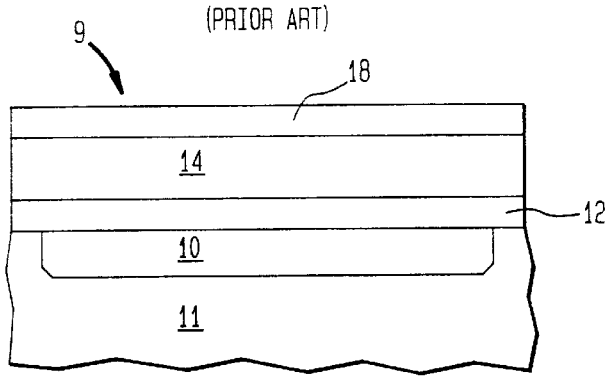
FIG. 1 is a cross-sectional illustration of the layers of a prior art semiconductor device.
Figure 2:
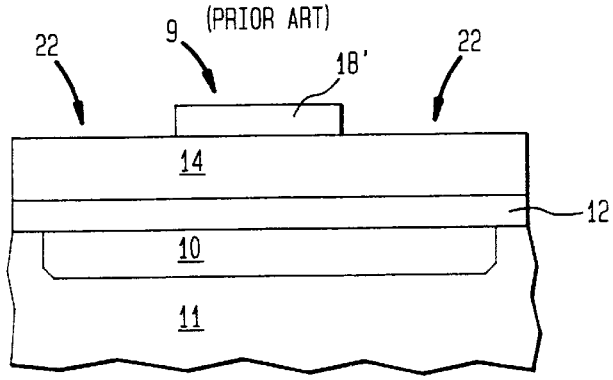
FIG. 2 is a cross-sectional illustration of the semiconductor device of FIG. 1 following exposure and developing of the photoresist.
Figure 3:
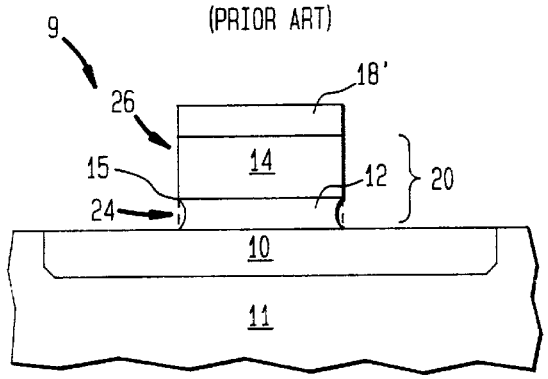
FIG. 3 is a cross-sectional illustration of the semiconductor device of FIG. 2 following a RIE step.
Figure 6:
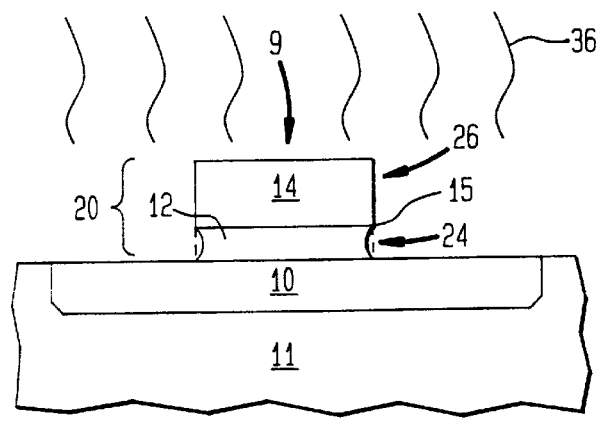
FIG. 6 is a cross-sectional illustration of the semiconductor device of FIG. 3 being treated in accordance with an exemplary embodiment of the present invention.

Referring now to FIG. 6, there is shown an illustration of gate 20', similar to gate 20 of FIG. 2, undergoing an exemplary process of the present invention. In accordance with the present invention, first the wafer 9, including undercut 24 in gate oxide 12, is exposed to an unbiased, isotropic chlorine plasma 36. The chlorine plasma 36 introduces chlorine at high concentrations into the near surface of the exposed silicon, to depths of about 10–20 Angstroms. Then the silicon is exposed to an oxidizing ambient for a predetermined time period at a temperature of between about 750° C. and about 850° C. Preferably, the temperature may be about 800° C.

Figure 4:
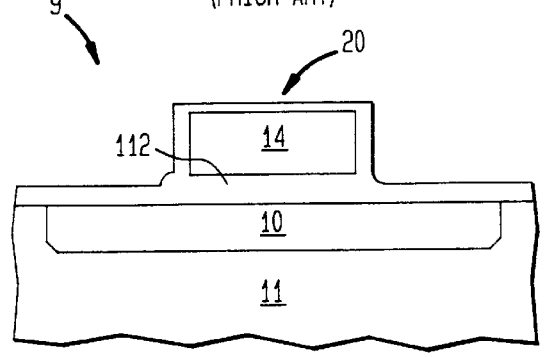
FIG. 4 is a cross-sectional illustration of the semiconductor device of FIG. 3 following re-growth of the oxide layer.

The time period required for an 800° C. oxidation step following treatment with the chlorine plasma is equivalent to the time period required for a 1025° C. oxidation without the chlorine plasma. The resulting gate structure 20' having re-grown oxide layer 12, is similar to gate structure 20 constructed in accordance with the prior art as shown in FIG. 4. The gate structure 20' constructed in accordance with the exemplary process of the present invention, however, includes chlorine ions in the oxide layer.

Alternatively, a high-temperature oxidation step following exposure to chlorine plasma could be conducted in less time than a high-temperature oxidation step without prior chlorine exposure. This may also result in the reduced diffusion of dopant distributions in the well.

The use of plasma to deliver chlorine to the silicon surface provides a much higher chlorine concentration at the silicon surface than the use of HCl gas (or other halogen-containing gases) during the oxidation process. Furthermore, the higher chlorine concentration at the surface provides for an increased oxidation rate at the low oxidation temperatures of the present invention as compared to the oxidation rate using a halogen-containing gas during the oxidation process. It may be possible to achieve 30–40% chlorine in the surface with the plasma process, while the gas phase method is restricted to a few percent because the surface is oxidized simultaneously with the chlorine exposure, thus preventing further chlorine penetration.

In addition, an unbiased, isotropic plasma is essential when it is necessary for the chlorine to contact structures having non-planar topography, such as an undercut gate sidewall. For planar structures, a biased or anisotropic plasma may be used.

Figure 7:
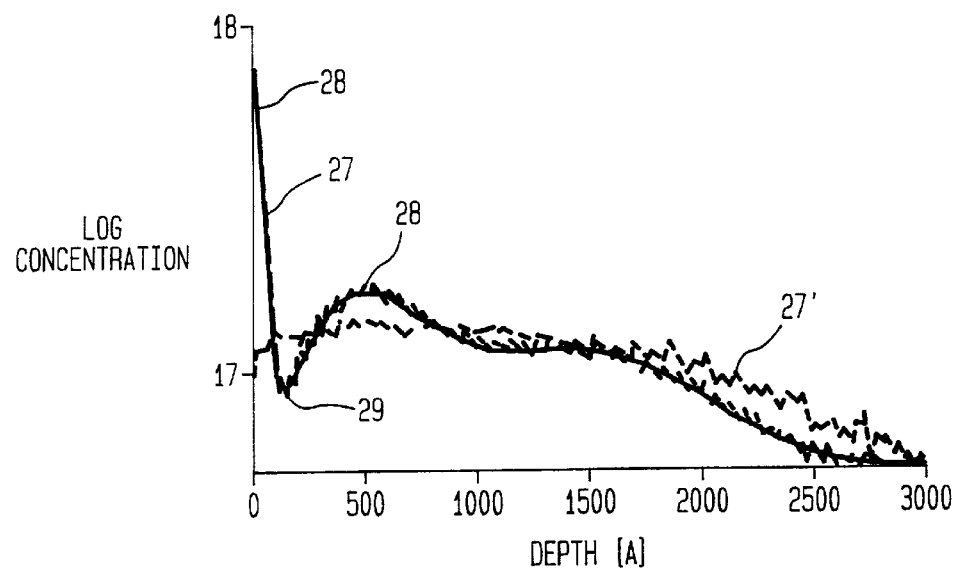
FIG. 7 is a graph representing the concentration of dopants with respect to the depth of a doped region after oxidation.

Referring now to FIG. 7, there is shown a graph depicting well depth in Angstroms vs. the $\log_{10}$ of dopant concentration in atoms/cubic centimeter, after oxidation. Curve 27 represents the well doping distribution after a low-temperature oxidation step of the present invention. Curve 27 has distinct peaks 28 and a distinct valley 29 of dopant concentration at selected depths, essentially the same as the desired peaks and valleys prior to oxidation (not shown). Such peaks and valleys represent an optimal distribution of dopants necessary for maximized device performance, such as for threshold-adjust and anti-punchthrough implants for buried channel devices, for example.

Curve 27', on the other hand, depicts the well doping distribution after a high-temperature oxidation. Curve 27', as shown in FIG. 7, has a flattened distribution devoid of distinct peaks or valleys, due to diffusion of the dopants during the high-temperature step. The flattened dopant distribution may have a negative impact on device performance.

The use of the process of the present invention for sidewall oxidation is especially advantageous, because sidewall oxidation is one of the remaining long, high-temperature processes that diffuses the dopants. Stabilization anneals used after the dopants are implanted can minimize the dopant movement in subsequent anneals when the subsequent anneals are short, as in the activation of source/drain implants and in contact silicide formation. Thus, sidewall oxidation presents a greater dopant diffusion risk than the subsequent anneals, and requires additional protection such as the process of the present invention.

The process of exposing silicon to a chlorine plasma and then exposing the silicon to an oxidizing ambient at a lower-than-normal oxidation temperature may be applied to any silicon oxidation process step where it is desired to keep temperatures low for any reason.

Figure 8:
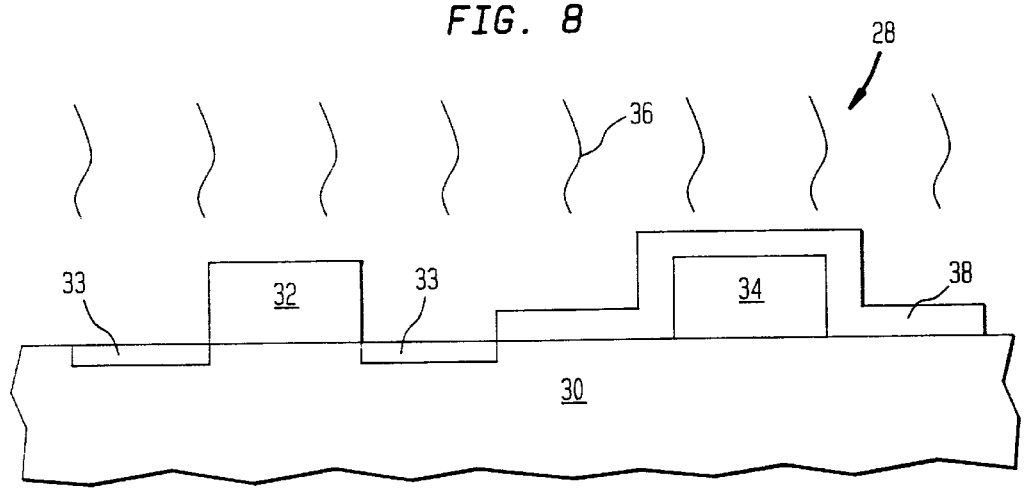
FIG. 8 is a cross-sectional illustration of a pFET and an nFET structure on a substrate, having a p+ diffusion region adjacent to the pFET gate.
Figure 9:
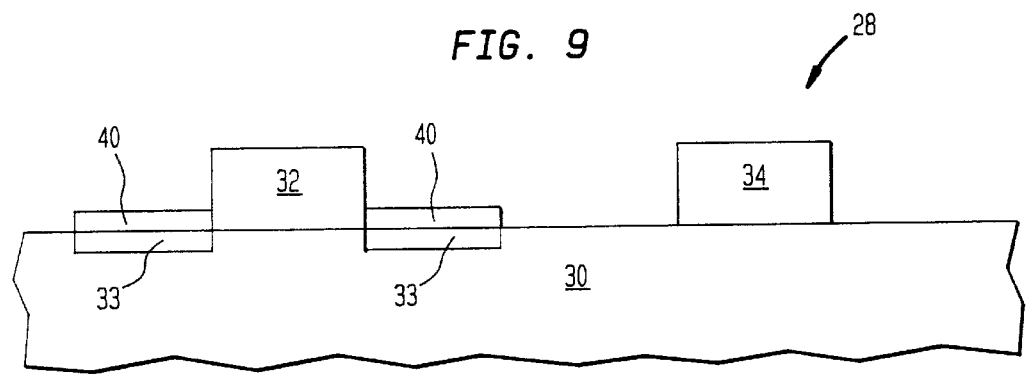
FIG. 9 is a cross-sectional illustration of the pFET and nFET structures of FIG. 8 following creation of a protective oxide layer over the p+ diffusion region in accordance with an exemplary embodiment of the present invention.
Figure 10:
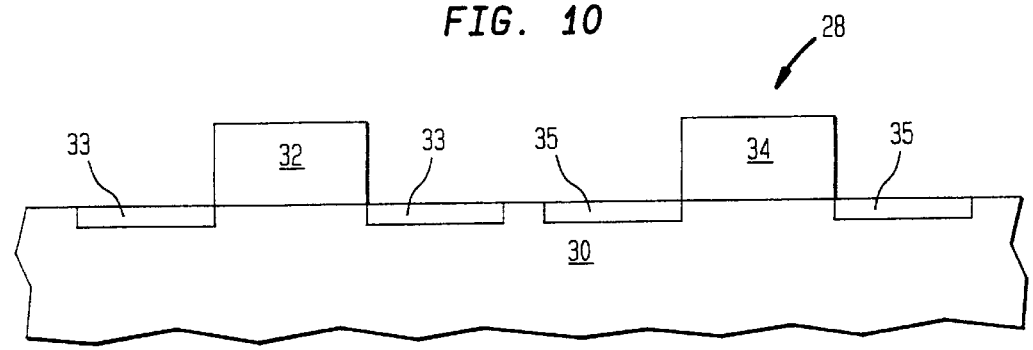
FIG. 10 is a cross-sectional illustration of the structures of FIG. 9 following further process steps.
Figure 11:
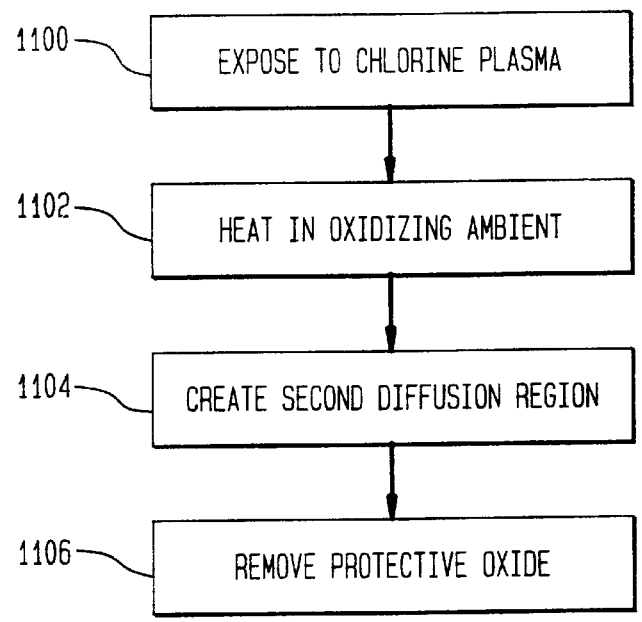
FIG. 11 is a flowchart depicting the process of the present invention as applied to the exemplary embodiment illustrated in FIGS. 8–10.

The process of the present invention may further be used in a process for integration of n- and p-type diffusion sources into a silicon substrate. Referring now to FIGS. 8–11, there is shown a schematic illustration in FIGS. 8–10 of a portion of a wafer 28 undergoing steps in an exemplary process depicted in the flowchart of FIG. 11. Wafer 28 comprises a silicon substrate 30 having a pFET gate 32 and an nFET gate 34 thereon, and a p+ diffusion region 33 adjacent to pFET gate 32. The process generally comprises (a) at Step 1100, exposing the wafer 28 to a chlorine plasma 36 as illustrated in FIG. 8; (b) at Step 1102, exposing the wafer to an oxidizing ambient for a predetermined time period at a temperature of between about 650° C. and about 750° C. to provide an oxide layer 40 over the p+ diffusion region 33 as illustrated in FIG. 9; (c) at Step 1104, creating an n+ diffusion region 35 (shown in FIG. 10) adjacent to nFET gate 34; and (d) at Step 1106, etching away the oxide layer 40, achieving the resulting structure shown in FIG. 10.

The above process may also be performed where the n+ diffusion region 35 is created first and protected with the oxide layer grown in accordance with the present invention, and the oppositely-charged p+ region 33 is created second.

The diffusion regions 33 and 35 may be created by a solid state diffusion process using an applied layer of appropriately doped glass (boronsilica glass (BSG) for the p+ region 33 and arsenicsilica glass (ASG) for the n+ region 35, for example) and annealing. The presence of oxide layer 40 over the p+ diffusion region 33 while the n+ diffusion region 35 is being formed protects the p+ region.

The diffusion regions 33 and 35 may be created by any process known in the art, which may include protecting the nFET gate 34 and future n+ diffusion region 35 with a layer of tetraethylorthosilicon (TEOS) 38 (shown in FIG. 8) during the creation of p+ diffusion region 33, treatment with chlorine plasma 36, and subsequent creation of oxide layer 40. Conversely, if the n+ diffusion region 35 is created first, the TEOS layer 38 would protect the pFET gate 32 and future p+ diffusion region 33 during creation of the n+ region 35 and creation of a protective oxide layer in accordance with the present invention.

The order and manner of creation of the diffusions is unimportant, however, to the present invention. What is important, is that the protective oxide is created by a low-temperature oxidation step enabled by prior exposure to a chlorine plasma 36. With TEOS layer 38 over the nFET gate 34 and n+ diffusion region 35, only the p+ diffusion region 33 and adjacent pFET gate 32 are exposed, so the protective oxide 40 will only grow over the silicon diffusion region 33 during the oxidation step. Low-temperature oxidation is important because creating protective oxide 40 by a high-temperature oxidation step would cause undesired diffusion of the dopants deeper into diffusion region 33 while oxide 40 is being created.

In both the exemplary process embodiments for sidewall oxidation and for integration of the diffusion sources, the process steps of the present invention are used to create what may be referred to as a "sacrificial oxide". A sacrificial oxide is sacrificial in the sense that it serves a particular purpose, such as to protect one diffusion source while another one is created, and then all or a part of it is later removed. Sacrificial oxides may also be used to remove residual pad nitride from active device regions, to protect the exposed silicon surface from contamination and plasma ion damage during mask and etch processing, and/or to remove damaged or contaminated silicon prior to gate oxidation. Using the chlorine plasma step prior to oxidation avoids the need for a high-temperature oxidation process that may redistribute the well-doping concentrations.

Figure 12:
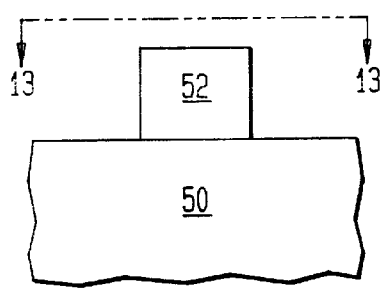
FIG. 12 is a cross-sectional illustration of a cylindrical, vertical gate structure according to a second exemplary embodiment of the present invention.
Figure 13:
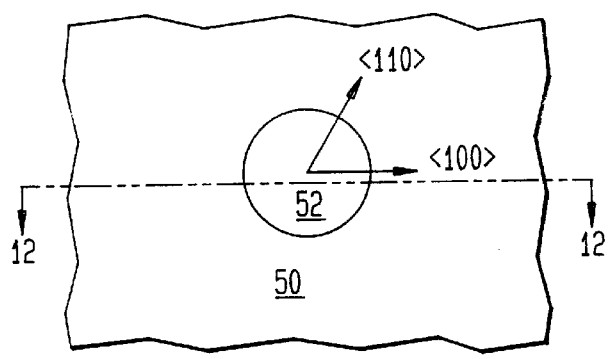
FIG. 13 is a plan view of the cylindrical, vertical gate structure of FIG. 12.

Yet another application of the present invention is in the development of vertical gate structures in high-density applications. Referring now to FIGS. 12 and 13, there is shown a substrate 50 having a vertical FET 52 with a cylindrical structure disposed thereon. Because of the cylindrical geometry, FET 52 has both a <110> crystallographic orientation and a <100> crystallographic orientation around its circumference. Different crystallographic orientations have different surface reaction rate constants, and thus different oxidation rates. As a result, the <110> orientation oxidizes faster than the <100> orientation. The differing oxidation rates may result in gate oxides with non-uniform thickness around the cylinder. This effect can be minimized by reducing the surface reaction rate constant by the use of an impurity. Reduction of the surface reaction rate constant overall, minimizes its impact on the oxidation rate.

In accordance with the present invention, the impurity introduced to the silicon is chlorine. The chlorine is introduced by exposing the silicon to an isotropic chlorine plasma. The isotropic plasma is particularly useful for assuring the non-planar topography of the cylindrical structure of FET 52 is evenly bombarded with chlorine. Chlorine also increases the parabolic rate constant—the rate at which the oxygen diffuses through the oxide to the oxide/silicon interface—further reducing the difference in oxidation rates between <100> and <110> silicon. Thus, when the wafer is exposed to the oxidizing ambient, the oxidation rates are more similar for each silicon orientation, and the resulting oxide thickness around the cylinder is more nearly uniform.

Although a reduced temperature may be used with this process, because there is no particular need to have a reduced temperature due to doping considerations, a normal temperature of 900–1200° C. may be used, resulting in a faster oxidation step.

Although the exemplary processes described herein have been described with respect to silicon substrates, the process according to the present invention is not limited to silicon. Other semiconductive, oxidizable materials, such as germanium or germanium/silicon alloys, may also benefit from the process steps of the present invention.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A process for thermal oxidation of a semiconductor substrate having at least one doped region doped with at least one dopant, each doped region subject to a first amount of diffusion of said dopant when said substrate is heated at a first temperature greater than about 850° C. for a first time period, said first time period comprising an amount of time required to grow an oxide region having a predetermined thickness when said substrate is heated in an oxidizing ambient at the first temperature, the process comprising the steps of:

(a) introducing chlorine ions into the substrate by exposing the substrate to a chlorine plasma, and then
   (b) growing the oxide region of said predetermined thickness by heating the substrate in one of (1) the oxidizing ambient at a second temperature less than said first temperature, and (2) the oxidizing ambient at said first temperature for a second time period less than said first time period;

wherein performance of steps (a) and (b) result in a second amount of diffusion that is less than said first amount of diffusion.

2. The process according to claim 1, wherein the semiconductor substrate comprises silicon, germanium, or a combination thereof.

3. The process according to claim 2, wherein in step (b) the semiconductor substrate is heated at a temperature of between about 750° C. and about 850° C.

4. The process according to claim 2, wherein said semiconductor substrate has a first diffusion region therein, and step (b) further comprises heating said substrate at said second temperature for growing a protective oxide layer over said first diffusion region, said second temperature comprising a temperature in a range of between about 650° C. and about 750° C.

5. The process according to claim 4 further comprising the steps of:

c) creating a second diffusion region in the semiconductor substrate; and
   d) removing the protective oxide layer.

6. The process according to claim 1, wherein step (a) includes exposing the semiconductor substrate to an unbiased, isotropic chlorine plasma.

7. A process for thermal oxidation of a semiconductor substrate comprising a first diffusion region therein, the process comprising the steps of:

a) exposing the substrate to a chlorine plasma, and then b) heating said substrate in an oxidizing ambient at a temperature of between about 650° C. and about 750° C. for growing a protective oxide layer over said first diffusion region.

8. The process according to claim 7, wherein the process further comprises the steps of:

c) creating a second diffusion region; and d) removing the protective oxide layer.

9. A process for simultaneous thermal oxidation of a plurality of crystallographic orientations, the process comprising the steps of:

a) introducing chlorine ions into the plurality of crystallographic orientations by exposing the plurality of crystallographic orientations simultaneously to a chlorine plasma, and then b) heating the plurality of crystallographic orientations simultaneously in an oxidizing ambient.

10. The process according to claim 9, wherein the plurality of crystallographic orientations comprise silicon, germanium, or a combination thereof.

11. The process according to claim 9, wherein the chlorine plasma is an unbiased, isotropic chlorine plasma.

12. The process according to claim 1, wherein step (b) includes the step of creating a sacrificial oxide.

13. The process according to claim 1, wherein said semiconductor substrate further comprises a gate having a gate oxide, and said process further comprises prior to step (a) the step of exposing said gate to an etching process that forms an undercut in said gate oxide, and wherein step (b) further comprises the step of growing an oxide layer for repairing said undercut.

14. A process for thermal oxidation of a semiconductor substrate, the process comprising the steps of:

a) exposing the substrate to a chlorine plasma, and then b) heating the substrate in an oxidizing ambient to create a sacrificial oxide.

15. A process for thermal oxidation of a semiconductor substrate comprising a gate having a gate oxide, the process comprising the steps of:

a) exposing said gate to an etching process that forms an undercut in said gate oxide, then b) exposing the substrate to a chlorine plasma, and then c) heating the substrate in an oxidizing ambient to grow an oxide layer for repairing said undercut.

* * * * *